United States Patent
Wu

(10) Patent No.: US 8,850,176 B2
(45) Date of Patent: Sep. 30, 2014

(54) ELECTRONIC DEVICE AND SPEED-UP BOOTING MODULE AND METHOD THEREOF USING HEAT PIPES

(75) Inventor: Chi-Jung Wu, New Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 242 days.

(21) Appl. No.: 13/542,526

(22) Filed: Jul. 5, 2012

(65) Prior Publication Data

US 2013/0198501 A1 Aug. 1, 2013

(30) Foreign Application Priority Data

Jan. 31, 2012 (CN) .......................... 2012 1 0020129

(51) Int. Cl.
   *G06F 1/00* (2006.01)
   *H01L 23/427* (2006.01)
   *G06F 9/44* (2006.01)

(52) U.S. Cl.
   CPC ............ *G06F 9/4401* (2013.01); *H01L 23/427* (2013.01)
   USPC ........................... 713/2; 361/679.52; 361/700

(58) Field of Classification Search
   CPC .... G06F 1/203; G06F 9/4401; G06F 11/3058
   USPC .................................. 361/679.02, 700; 713/2
   See application file for complete search history.

(56) References Cited

U.S. PATENT DOCUMENTS

| 6,946,216 B2 * | 9/2005 | Mu-Tsai et al. ................. 429/62 |
| 8,527,746 B2 * | 9/2013 | Jeng et al. .......................... 713/2 |
| 2007/0002559 A1 * | 1/2007 | Uke .............................. 362/157 |

FOREIGN PATENT DOCUMENTS

TW            I336235            1/2011

* cited by examiner

*Primary Examiner* — Albert Wang

(57) ABSTRACT

A speed-up booting module of an electronic device includes a first heat pipe with two ends connected to a first component and a second component respectively, and the first heat pipe including a first working fluid, wherein when a booting process is performed at a first environmental temperature, the heat from the first component in operation is transferred to the second component so that a temperature of the second component reaches an operating temperature; and a second heat pipe with two ends connected to the first component and a third component respectively, and the second heat pipe including a second working fluid, a boiling point of the second working fluid is higher than the boiling point of the first working fluid; wherein at a second environmental temperature, a temperature of the second component reaches the boiling point, the heat from the first component is transferred to the second component.

17 Claims, 6 Drawing Sheets

ELECTRONIC DEVICE AND SPEED-UP BOOTING MODULE AND METHOD THEREOF USING HEAT PIPES

BACKGROUND

1. Technical Field

The disclosure relates to an electronic device and speed-up booting module and method thereof, and in particular, to an electronic device and speed-up booting module having cooling and heating functions and method thereof.

2. Related Art

With rapid development of technology, each kind of electronic devices becomes necessary tools in daily life. The design trend in the modern electronic devices, such as laptop, is towards, being slim, light and highly efficient. Because of the design trend mentioned above, the electronic device with a smaller volume should keep the same efficiency as the electronic device with a usual volume, and furthermore, the problems generated by an operating temperature of the electronic device should be solved. Heat generated by operating an electronic component, such as microprocessor, may have an influence on an operation of the electronic device. A conventional solution is disposing a heat dissipation module on the microprocessor to dissipate the heat from the microprocessor.

Moreover, take military laptop as an example, the military laptop may be booted and operated in an extremely low temperature state. Therefore, each electronic component of the military laptop must operate normally at low temperature. Take fluid dynamic bearing hard disk (FDB hard disk) as an example, the FDB is generally used as a bearing structure of a hard disk. At room temperature, an oil film of the FDB is in a liquid phase. When an ambient temperature is below a melting point of the oil film, the oil film may be changed into a solid phase, resulting in abnormal operations of the FDB hard disk. In order to solve the above-mentioned problem, a heater is disposed on the FDB hard disk. When the electronic device is in an extremely low temperature environment, the heater heats the FDB hard disk to make the temperature of the FDB hard disk rise to its operating temperature.

However, as for the military laptop, in order to solve the heat problem generated by the operation of the microprocessor, the heat dissipation module needs to be disposed for supplying heat dissipation at high temperature. And in order to solve the problem of the solidified oil film of the FDB, the heater needs to be disposed for supplying heating at low temperature. Hence, the two components are disposed simultaneously. Therefore, it is not beneficial for the designs of being slim, light and with high efficiency which leads to high manufacturing cost.

SUMMARY

An embodiment discloses a speed-up booting module of an electronic device, the speed-up booting module of the electronic device comprises a first heat pipe and a second heat pipe. The first heat pipe comprises a hot end connected to a first component; a cold end connected to a second component; and a first working fluid. Wherein when a booting process is performed at a first environmental temperature, the first environmental temperature is higher than or equal to a boiling point of the first working fluid, the heat from the first component in operation is transferred to the second component so that a temperature of the second component reaches an operating temperature of the second component. The second heat pipe comprises a hot end connected to the first component; a cold end connected to a third component; and a second working fluid, a boiling point of the second working fluid of the second heat pipe is higher than the boiling point of the first working fluid of the first heat pipe. Wherein at a second environmental temperature, a temperature of the second component reaches the boiling point of the second working fluid, and the hear from the first component in operation is transferred to the third component.

An embodiment discloses a speed-up booting module of an electronic device, the speed-up booting module of an electronic device comprises a first heat pipe. The first heat pipe comprises a hot end connected to a first component; a cold end connected to a second component; and a first working fluid. Wherein when a booting process is performed at a first environmental temperature, the first environmental temperature is higher than or equal to a boiling point of the first working fluid, the heat from the first component in operation is transferred to the second component so that a temperature of the second component reaches an operating temperature of the second component.

An embodiment discloses a method for speed-up booting an electronic device, the method for speed-up booting the electronic device comprises providing a first heat pipe, the first heat pipe comprising a hot end connected to a first component, a cold end connected to a second component, and a first working fluid; providing a second heat pipe, the second heat pipe comprising a hot end connected to the first component, a cold end connected to a third component, and a second working fluid, wherein a boiling point of the second working fluid of the second heat pipe is higher than a boiling point of the first working fluid of the first heat pipe; performing a booting process to provide a first power supply at an first environmental temperature, the first power supply being supplied to the first component, wherein the first component generates a first thermal change and the first working fluid of the first heat pipe transfers heat from the first component to the second component, so that a temperature of the second component reaches an operating temperature of the second component; booting the second component to complete the booting process; and providing a second power supply, the second power supply being supplied to the first component, wherein the first component generates a second thermal change and the first working fluid of the first heat pipe transfers heat from the first component to the second component, and the second working fluid of the second heat pipe transfers the heat from the first component to the third component.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1:
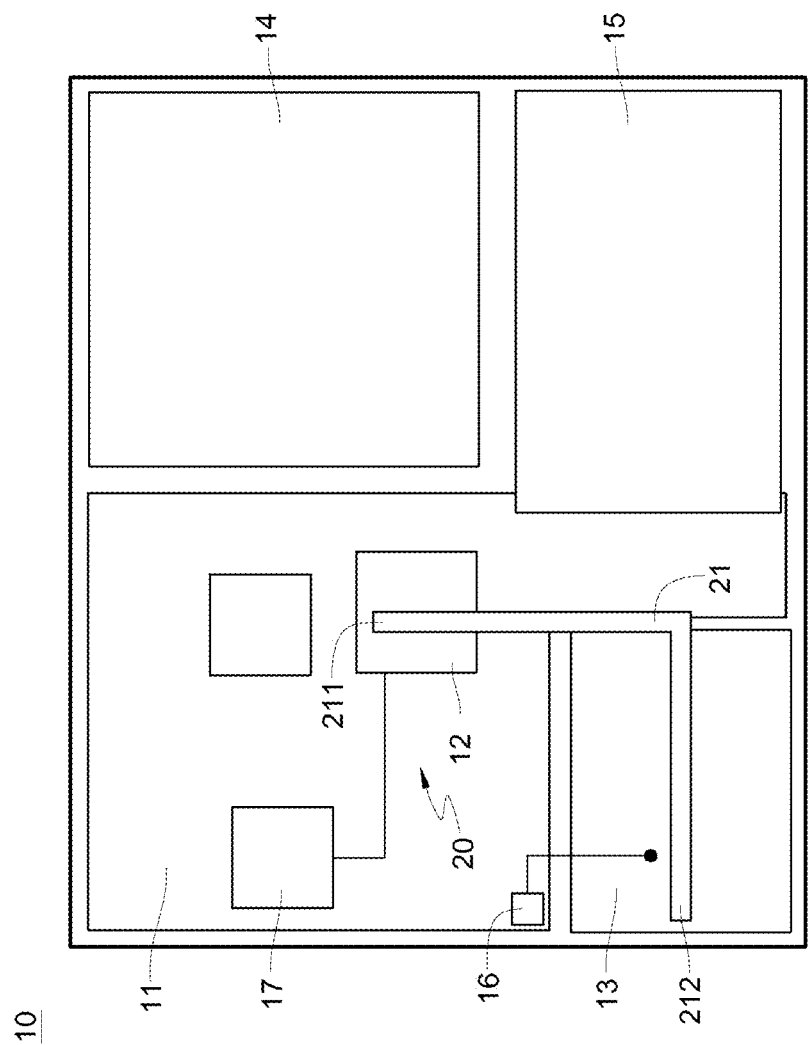
FIG. 1 is a schematic view of an electronic device according to first embodiment.

The detailed features and advantages of the disclosure are described below in great detail through the following embodiments, the content of the detailed description is sufficient for those skilled in the art to understand the technical content of the present disclosure and to implement the disclosure there accordingly. Based upon the content of the specification, the claims, and the drawings, those skilled in the art can easily understand the relevant objectives and advantages of the disclosure.

The following describes a speed-up booting method of an electronic device according to an embodiment. Please refer to FIG. 1 which is a schematic view of an electronic device according to first embodiment.

An electronic device and speed-up booting module and method thereof according to an embodiment are applicable to a low temperature environment. When a current flows through a component, heat is generated to perform heating on another component without disposing other heater.

This embodiment discloses an electronic device 10 comprising a circuit board 11, a first component 12, a second component 13, a third component 14 and a power module 15. For example, the electronic device 10 is a laptop, the first component 12 is a central processing unit (CPU), the second component 13 is an FDB hard disk, the third component 14 is an optical driver (for example, compact disc driver) and the power module 15 is a battery. The above-mentioned components constitute a basic hardware structure of a computer system. When the booting process of the electronic device 10 is executed, the power module 15 supplies power to each component to complete the booting process, but the examples of the above-mentioned components are not limited to the embodiment. For example, the electronic device 10 may be a desktop computer, a server, a mobile phone, a smart phone, a tablet computer or a portable music player; the first component 12 may be a microprocessor or a graphics processing unit (GPU); the second component 13 may be a power supply module; the third component 14 may be a GPU module.

In the electronic device and speed-up booting module and method thereof according to the disclosure of the embodiment, "booting" defines that the electronic device 10 enters a normal mode from a hibernation mode, a sleep mode, a low power mode or an off mode.

In this embodiment, a speed-up booting module 20 comprises a first heat pipe 21 containing a first working fluid. The first working fluid may be Freon-22, $NH_3$, Freon-113, Acetone ($C_3H_6O$), Methanol or water ($H_2O$), but the above-mentioned working fluids are not limited to the embodiment and the working fluid is adjusted according to actual environment and components requirement. In this embodiment, the first working fluid should be a low-boiling-point fluid, such as $NH_3$, and a boiling point of $NH_3$ is −33.4 degrees Celsius. Otherwise, in another embodiment, we take water as the first working fluid and change the pressure inside the first heat pipe 21 to lower the boiling point of the water.

Figure 6:
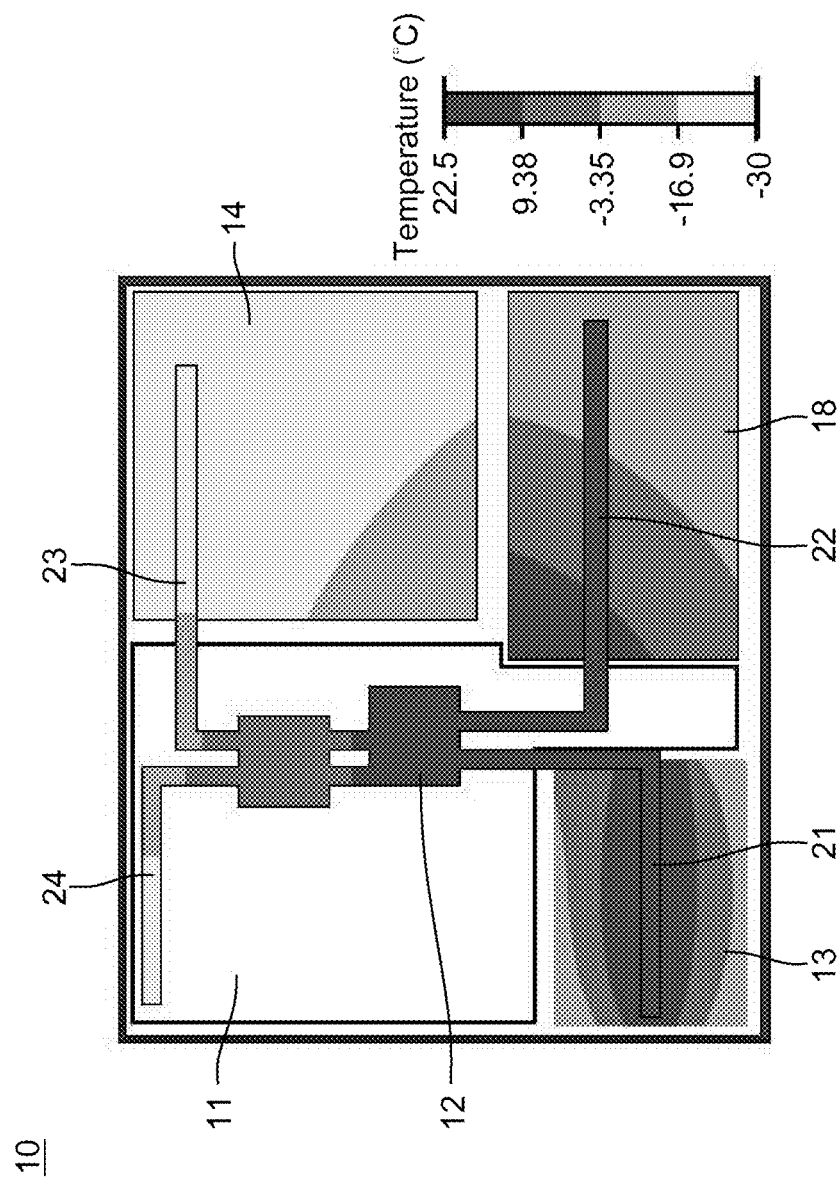
FIG. 6 is a simulation view of a speed-up booting method of an electronic device according to second embodiment.

In this embodiment, an end of the first heat pipe 21 is a hot end 211 and the other end of the first heat pipe 21 is a cold end 212. The hot end 211 is in thermal contact with the first component 12 and the cold end 212 is in thermal contact with the second component 13. In a cold temperature environment, an operating temperature of the second component 13 is above the current temperature at this time. When power is supplied to the first component 12 to generate heat (i.e. during the booting process or during a general operation after the booting process is complete), a relative high temperature is generated by the operation of the first component 12. Therefore, a heat exchange process is performed by a liquid-gas phase transition in the first heat pipe 21. Then, the heat is transferred to the cold end 212 from the hot end 211. Because the cold end 212 is in thermal contact with the second component 13, a temperature of the second component 13 reaches the operation temperature of the second component 13 gradually. For example, as shown in FIG. 6, FIG. 6 is a simulation view of a speed-up booting method of an electronic device according to second embodiment. In a low temperature environment (i.e. −30 degrees Celsius), when the first component 12 receives 15 Watts (W) power to generate the heat, the second component 13 receives the heat from the first component 12 so that the temperature of the second component 13 rises to −5 degrees Celsius. At this time, the temperature of the second component 13 is higher than the operation temperature (i.e. −20 degrees Celsius) of the second component 13. Therefore, this environmental condition satisfies an operating condition of the second component 13 (the temperature of the second component 13 is above or equal to the operation temperature) and the second component 13 is ready to boot, thereby achieving the effect of speeding up booting.

Moreover, the electronic device and speed-up booting module and method thereof according to the disclosure of the embodiment are applicable to a high temperature environment. The computing efficiency of the first component 12 decreases when the temperature of the first component 12 is high, thereby affecting whole operation of the electronic device 10. In the high temperature environment (that is, when the electronic device 10 is operated normally), the first component 12 needs to be cooled down to increase the computing efficiency. Therefore, when the first component 12 is in an operating state, the heat generated by the first component 12 is evenly distributed in the electronic device 10 by the first heat pipe 21 and is even distributed to the second component 13. That is to say, a heat dissipation is performed on the first component 12 by the first heat pipe 21, thereby achieving the effect of cooling the first component 12 by the speed-up booting module 20.

According to another embodiment, in the low temperature environment, when the second component 13 is the FDB hard disk and the FDB cannot reduce friction effectively because of solidification of an oil film in the FDB hard disk. In order to protect the FDB hard disk from failure, the second component 13 can be set not to boot when the temperature of the second component 13 does not reach the operating temperature. In this embodiment, in order to detect the temperature of the second component 13, a first thermal sensor 16 is disposed in the electronic device 10 for detecting the temperature of the second component 13. When the temperature of the second component 13 reaches the operating temperature, the second component 13 may be enabled, but the above-mentioned manner is not limited to the embodiment. In other embodiment, the second component 13 has a similar built-in temperature mechanism to detect its temperature and to determine whether the second component 13 may be enabled.

According to other embodiment, when the second component 13 is a power supply component for supplying power to other components in the electronic device 10 to perform the booting process and the power supply component is also a power source of all components in normal operation. But in the low temperature environment, the first component 12 cannot perform the booting process because of the property of the power supply component. For example, an electrolyte solution of the power supply component may easily be solidified when the temperature is too low to generate power. In other words, in this embodiment, the second component 13 is the component which needs to be heated in the low temperature environment. Therefore, a power supply device 17 is further disposed in the electronic device 10. When the second component 13 is a power supply component and cannot supply power normally to the first component 12 to perform the booting process in a low temperature state, the electronic device 10 replaces the second component 13 with the power supply device 17 to provide power to the first component 12 so that the first component 12 may perform the booting process and generate a thermal change.

Figure 2:
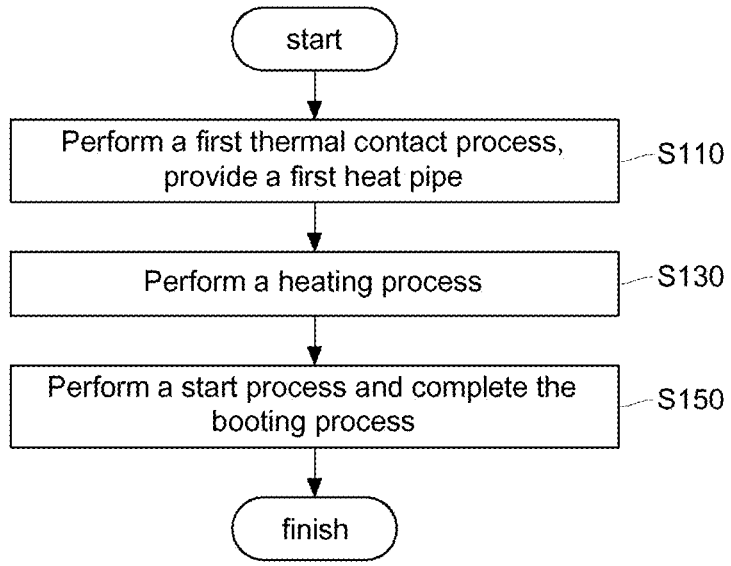
FIG. 2 is a flow chart of a speed-up booting method of an electronic device according to first embodiment.

In order to quickly boot the electronic device 10, the following describes a speed-up booting method of the speed-up booting module 20. Please refer to FIG. 1 and FIG. 2, FIG. 2 is a flow chart of a speed-up booting method of an electronic device according to first embodiment.

First, a first thermal contact process is performed and a first heat pipe 21 is provided (Step 110). In an electronic device 10, a hot end 211 of the first heat pipe 21 is in thermal contact with a first component 12, and a cold end 212 of the first heat pipe 21 is in thermal contact with a second component 13. A first working fluid is contained in the first heat pipe 21.

Afterwards, a heating process is performed on the second component 13 (Step 130). In a low temperature environment (the temperature is a first environmental temperature) and when the electronic device 10 is performed a booting process, a first power supply is provided to the first component 12 so that a first thermal change is generated by the first component 12. Heat from the first component 12 is transferred to the second component 13 by the liquid-gas phase transition of the first working fluid. After that, a temperature of the second component 13 rises and then reaches an operating temperature of the second component 13.

In this embodiment, in the low temperature environment (that is, the first environmental temperature), when the temperature of the second component 13 is not higher than the operating temperature of the second component 13 and the electronic device 10 is performed the booting process, a power module 15 provides the first power supply to the first component 12. Because of the characteristic of the first component 12, the first component 12 may convert the received power into the heat. The first component 12 is in thermal contact with the hot end 211 of the first heat pipe 21, so the heat is conducted to the first working fluid at the hot end 211. Afterwards, the first working fluid receives the heat energy so that the temperature of the first working fluid reaches a boiling point of the first working fluid, the first working fluid changes into a solid phase from a liquid phase. By receiving a large number of potential heat energy in the above-mentioned phase-transition manner, the first working fluid rapidly transfers the heat to the second component 13 connected to the cold end 222. Then, the second component 13 receives the heat from the first working fluid so that the temperature of the second component 13 rises. In this embodiment, the first environmental temperature may be −20 degrees Celsius and the operating temperature of the second component 13 may be 0 degree Celsius. It means that the temperature of the second component 13 may rise to 0 degree Celsius from −20 degrees Celsius.

Moreover, a start process is performed to complete the booting process (Step 150). In detail, when the temperature of the second component 13 reaches the operating temperature of the second component 13, the second component 13 may be booted. Then, the electronic device 10 may continue performing the booting process until the booting process of the electronic device 10 is completed and a normal operation mode is entered. In this embodiment, the temperature of the second component 13 is detected by a first thermal sensor 16. When the temperature of the second component 13 reaches the operating temperature, the second component 13 may be booted.

Figure 3:
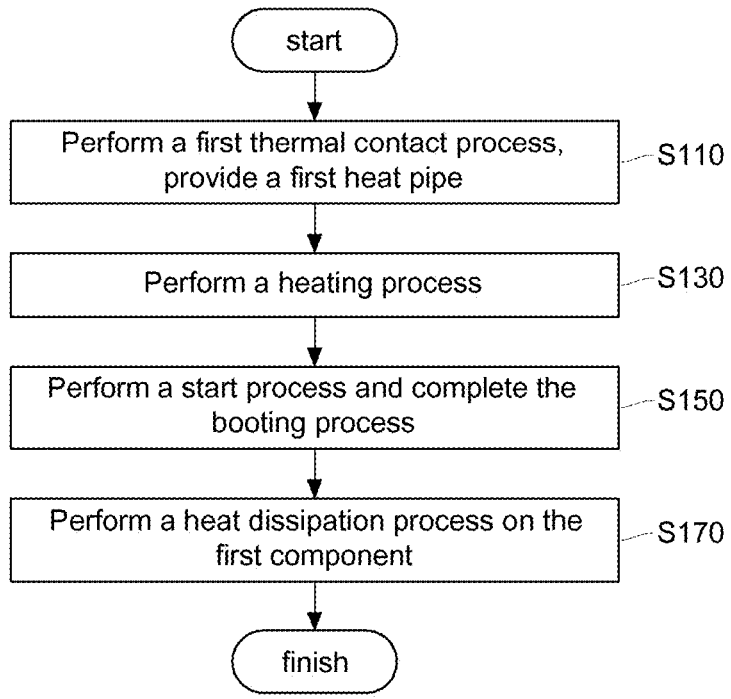
FIG. 3 is a flow chart of a speed-up booting and a heat dissipation method of an electronic device according to first embodiment.

After the above-mentioned processes are implemented and the electronic device 10 is maintained in a normal operation state, a heat dissipation process is performed on the first component 12 (Step 170). Please refer to FIG. 3, FIG. 3 is a flow chart of a speed-up booting and a heat dissipation method of an electronic device according to first embodiment. When the electronic device 10 is operated normally, a second power supply is provided to the first component 12 and a second thermal change is generated by the normal operation of the first component 12. Heat generated by the second thermal change is transferred to the second component 13 via the first heat pipe 21 and is distributed evenly in the electronic device 10. That is to say, while the electronic device 10 is operated normally, the first component 12 is executed its certain function to generate the thermal change by the power at the same time. On the other hand, the first component 12 performs a heat transfer on the connected first heat pipe 21 so that the temperature of the first component 12 decreases. Therefore, a heat dissipation effect of maintaining the temperature of the first component 12 in a normal range of the operating temperature is achieved.

In a conventional electronic device, when a temperature of the component does not reach its operating temperature, an additional heater needs to be disposed so the heater may heat the certain component. Hence, by the above description, it is understood that compared to the conventional electronic device, the speed-up booting module 20 of the embodiment performs the heating and the heat dissipation process with only one heat pipe, and an effect of speeding up booting is achieved.

Figure 4:
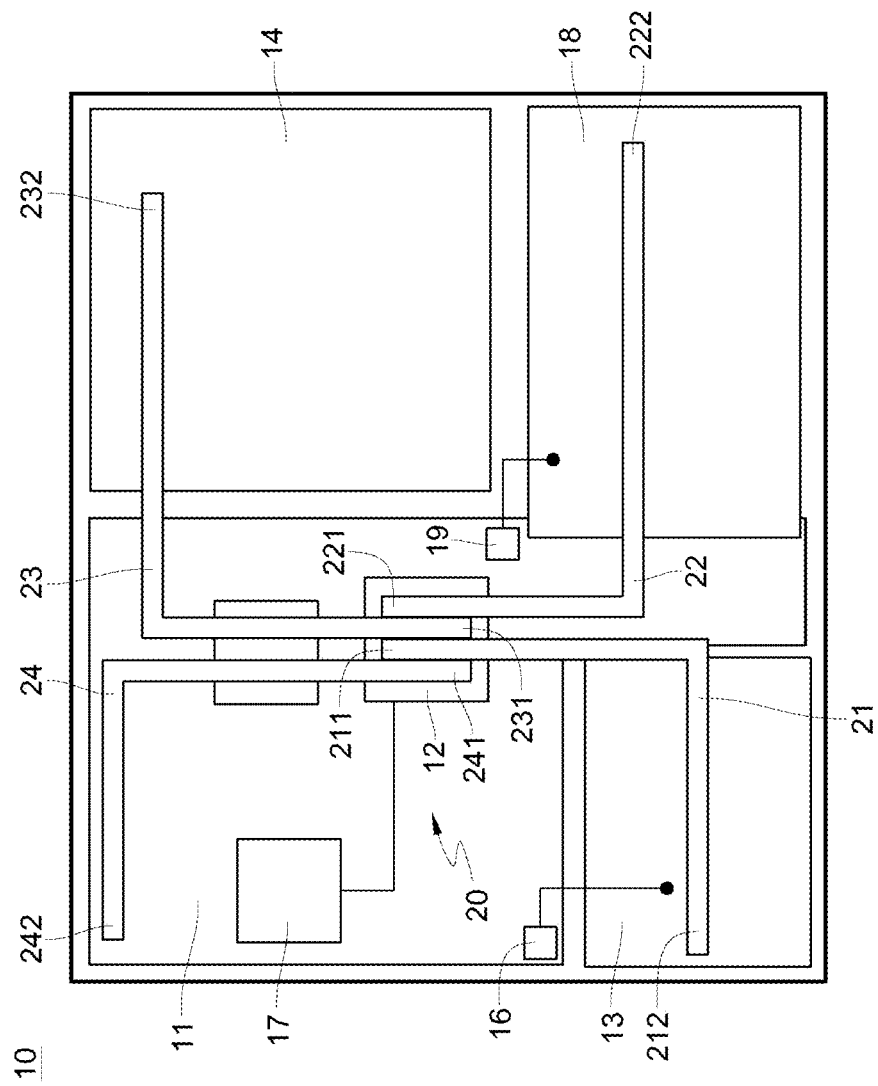
FIG. 4 is a schematic view of an electronic device according to second embodiment.

The above-mentioned description describes the electronic device with only one heat pipe. The following describes an electronic device with two kinds of heat pipes. Please refer to FIG. 4, FIG. 4 is a schematic view of an electronic device according to second embodiment. The specific implementation and elements of the second embodiment are substantially the same as those in the first embodiment. The element symbols in the second embodiment correspond to those in the first embodiment with the same function or structure which is not described again.

This second embodiment discloses an electronic device 10. The electronic device 10 comprises a circuit board 11, a first component 12, a second component 13, a second component 18 and a third component 14. For example, the electronic device 10 is a laptop, the first component 12 is a CPU, the second component 13 is an FDB hard disk, the third component 14 is an optical driver (for example, compact disc driver) and the second component 18 is a battery. The above-mentioned components constitute a basic hardware structure of a computer system. When the electronic device 10 is operated normally, the second component 18 is used for supplying power to other components to maintain all operations of each component.

A speed-up booting module 20 according to the embodiment comprises first heat pipes 21, 22 and second heat pipes 23, 24. The first heat pipe 21 includes a hot end 211 and a cold end 212. The hot end 211 is in thermal contact with the first component 12 and the cold end 212 is in thermal contact with the second component 13. The first heat pipe 22 includes a hot end 221 and a cold end 222. The hot end 211 is in thermal contact with the first component 12 and the cold end 212 is in thermal contact with the second component 18. A first working fluid is both contained in the first heat pipes 21, 22. The second heat pipe 23 includes a hot end 231 and a cold end 232. The hot end 231 is in thermal contact with the first component 12 and the cold end 232 is in thermal contact with the third component 14. The second heat pipe 24 includes a hot end 241 and a cold end 242. The hot end 241 is in thermal contact with the first component 12 and the cold end 242 is in thermal contact with the circuit board 11. A second working fluid is both contained in the second heat pipes 23, 24. Otherwise, the total amount of the first heat pipes and the second heat pipe of the electronic device 10 is not limited in the embodiment. In other embodiment, the amount is adjusted according to actual requirement.

In this embodiment, except the dispositions of the heat pipes, the main difference between the first heat pipe 21, 22 and the second heat pipe 23, 24 is that the first working fluid contained in the first heat pipe 21, 22 is set as the working fluid with a low boiling point and the second working fluid contained in the second heat pipe 23, 24 is set as the working fluid with a high boiling point. Therefore, in a low temperature environment, the first working fluid contained in the first heat pipe 21, 22 may perform heat exchange by the liquid-gas phase transition. Compared to the first working fluid, the boiling point of the second working fluid contained in the second heat pipe 23, 24 is higher than the boiling point of the first working fluid. When the electronic device 10 is booted in the low temperature environment, power supplied to the first component 12 is converted into heat. Because an environmental temperature is below the boiling point of the second working fluid, the second working fluid contained in the second heat pipe 23, 24 may not receive the heat form the heat source (the first component 12) and then effectively conduct the heat to the third component 14 and the circuit board 11 by the liquid-gas phase transition. That is to say, the second working fluid may not perform the heat exchange by the liquid-gas phase transition when the environmental temperature is below the boiling point of the second working fluid. Hence, the choice of the first and the second working fluid in this embodiment is that the first working fluid is set as the low-boiling-point working fluid, such as Freon-22, $NH_3$, Freon-113, Acetone ($C_3H_6O$), Methanol or water ($H_2O$) and the second working fluid may be water which has higher boiling point.

In addition to adopting different kinds of working fluid to differentiate the operating temperatures between the first heat pipe 21, 22 and the second heat pipe 23, 24, pressures in the first heat pipe 21, 22 and the second heat pipe 23, 24 may be adjusted for differentiating the operating temperatures between the first heat pipe 21, 22 and the second heat pipe 23, 24, either. For example, the first working fluid and the second working fluid may both be water. By removing air from the first heat pipe 21, 22 and the second heat pipe 23, 24, the pressures of the first heat pipe 21, 22 are adjusted to 8 kPa so that the boiling point of the first working fluid is about 30 degrees Celsius. The pressures of the second heat pipe 23, 24 are adjusted to be greater than 18.5 kPa so that the boiling point of the second working fluid is higher than 50 degrees Celsius. Therefore, by differentiating the boiling points between the first working fluid and the second working fluid, the gap between the operating temperatures of the first heat pipe 21, 22 and those of the second heat pipe 23, 24 is widened, thereby enlarging a suitable range of the operating temperature of the speed-up booting module 20.

In other embodiment, another arrangement of the first working fluid and the second working fluid is that the first working fluid and the second working fluid may both be water. The pressure of the first heat pipe 21, 22 is between 6 kPa and 10 kPa and the pressure of the second heat pipe 23, 24 is greater than 18.5 kPa. In this way, the gap between the operating temperatures of the first heat pipe 21, 22 and those of the second heat pipe 23, 24 is enlarged.

To sum up, by adjusting the pressure in the first heat pipe 21, 22 and the second heat pipe 23, 24 of the speed-up booting module 20 or differentiating between the kinds of the first working fluid and the second working fluid, the second working fluid contained in the second heat pipe 23, 24 may not perform the heat exchange to conduct the heat by the gas-liquid phase transition when the electronic device 10 is in the low temperature (the first environmental temperature) environment. Otherwise, the second working fluid contained in the second heat pipe 23, 24 may perform the heat exchange to conduct the heat by the gas-liquid phase transition when the electronic device 10 is in the high temperature (the second environmental temperature) environment. On the contrary, no matter where the electronic device 10 is in the low temperature environment or the high temperature environment, the first working fluid contained in the first heat pipe 21, 22 both performs the heat exchange to conduct the heat by the gas-liquid phase transition so that the first working fluid may rapidly receive the heat from the first component 12 and transfer the heat to the second component 13, 18. By this arrangement of the first working fluid and the second working fluid, heating controls of the first heat pipe 21, 22 and the second heat pipe 23, 24 to certain components in the electronic device 10 may be adjusted effectively. During the booting process of the electronic device 10, the heat may be rapidly transferred to components which need to be heated and heat waste is prevented by the above-mentioned arrangement of the first heat pipe 21, 22 and the second heat pipe 23, 24.

In this embodiment, when the electronic device 10 is operated normally in the low temperature environment, and the power supply source of each component is the second component 18 which is set as the component needs to be heated. Hence, a power supply device 17 is disposed in the electronic device 10 and is electronically connected to the first component 12. In the low temperature environment, the power supply device 17 supplies power to the first component 12 for performing the booting process. Otherwise, a first thermal sensor 16 and a second thermal sensor 19 are disposed on the circuit board 11 of the electronic device 10 respectively. The first thermal sensor 16 is used for detecting a temperature of the second component 13 and a second thermal sensor 19 is used for detecting a temperature of the second component 18.

In this embodiment, the high temperature (the second environmental temperature) environment means an environment when the general electronic device 10 enters a normal operation. That is to say, when the electronic device 10 is operated normally, the first heat pipe 21, 22 and the second heat pipe 23, 24 which are in thermal contact with the first component 12 take away the heat from the first component 12 respectively so that a heat dissipation process is performed on the first component 12.

Figure 5:
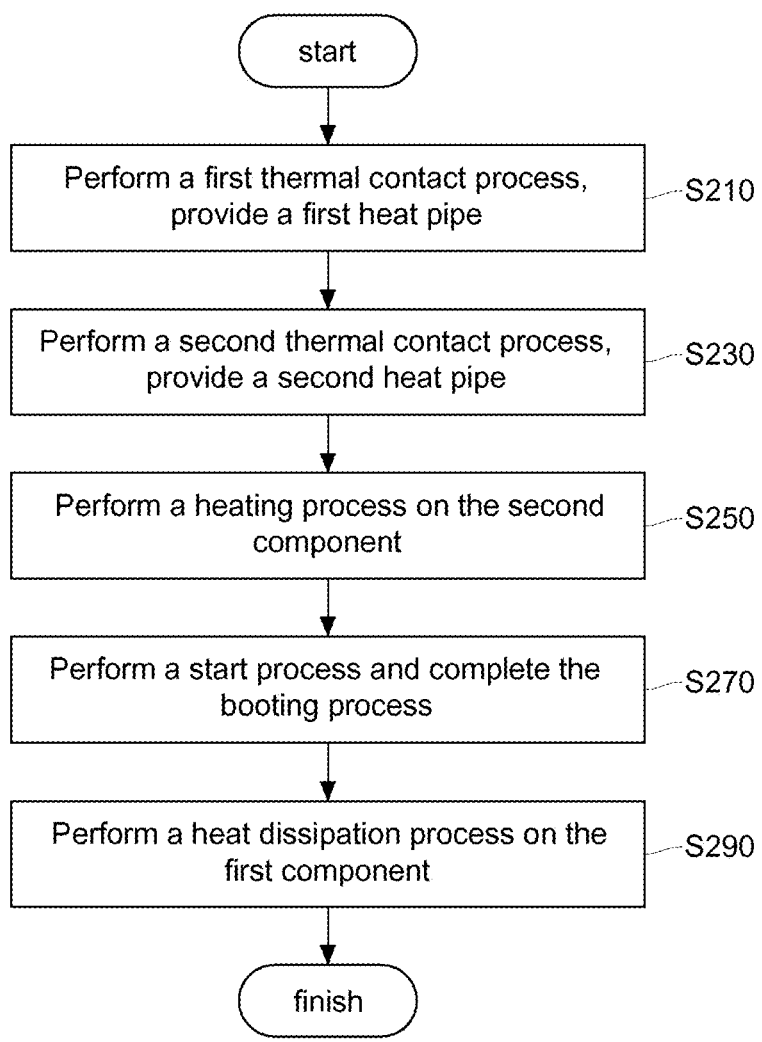
FIG. 5 is a flow chart of a speed-up booting and a heat dissipation method of an electronic device according to second embodiment.

The following describes a speed-up booting method of an electronic device with two kinds of heat pipe. Please refer to FIG. 4 and FIG. 5, FIG. 5 is a flow chart of a speed-up booting and a heat dissipation method of an electronic device according to second embodiment.

A first thermal contact process is performed and a first heat pipe 21 and a first heat pipe 22 are provided (Step 210). In an electronic device 10, a hot end 211 of the first heat pipe 21 is in thermal contact with the first component 12, and a cold end 212 of the first heat pipe 21 is in thermal contact with a second component 13. A hot end 221 of the first heat pipe 22 is in thermal contact with the first component 12, and a cold end 222 of the first heat pipe 22 is in thermal contact with a second component 18. A first working fluid is both contained in the first heat pipe 21, 22 respectively.

A second thermal contact process is performed, and a second heat pipe 23 and a second heat pipe 24 are provided (Step 230). A hot end 231 of the second heat pipe 23 is in thermal contact with the first component 12, and a cold end 232 of the second heat pipe 23 is in thermal contact with a third component 14. A hot end 241 of the second heat pipe 24 is in thermal contact with the first component 12, and a cold end 242 of the second heat pipe 24 is in thermal contact with a circuit board 11. A second working fluid is contained in the second heat pipe 23, 24 respectively. A boiling point of the second working fluid contained in the second heat pipe 23, 24 is higher than a boiling point of the first working fluid contained in the first heat pipe 21, 22.

Afterwards, a heating process is performed on the second component 13, 18 (Step 250). During a booting process, a first power supply is provided to the first component 12 so that a first thermal change is generated by the first component 12. The first working fluid of the first heat pipe 21 transfers the heat from the first component 12 to the second component 13 and the first working fluid of the first heat pipe 21 transfers the heat from the first component 12 to the second component 18 so that temperatures of the second component 13, 18 rises to operating temperatures of the second component 13, 18 respectively. At this time, because the temperature of the second working fluid is below the operating temperature of the second working fluid, the second working fluid contained in the second heat pipe 23 and the second heat pipe 24 may not perform heat transfer by a liquid-gas phase transition manner. Hence, the first component 12 receives power from a power supply device 17 and converts the power into the heat. Then most heat is transferred to the second component 13, 18 via the first working fluid contained in the first heat pipe 21, 22 respectively. Next, the temperatures of the second component 13, 18 rises to reach the operating temperatures of the second component 13, 18 respectively. By this above-mentioned heat conducting way, the heat may be rapidly transferred to components (the second component 13, 18 in this embodiment) which need to be heated and heat waste is prevented.

A start process is performed and the booting process is completed (Step 270). At this moment, by heating the second component 13, 18 to speed up the booting process, the booting process of the electronic device 10 may be continued and then completed.

A heat dissipation process is performed on the first component 12 (Step 290). When the electronic device 10 is operated normally, a second power supply is provided to the first component 12 and a second thermal change is generated by the normal operation of the first component 12. The heat generated by the second thermal change is transferred to the second component 13, 18 via the first working fluid of the first heat pipe 21, 22 and to the third component 14 and the circuit board 11 via the second working fluid of the second heat pipe 23, 24 respectively. That is to say, when the electronic device 10 is operated normally, the first component 12 is executed its certain function and generate the thermal change by the power. Simultaneously, the first component 12 performs heat transfer on the first heat pipe 21, 22 and the second heat pipe 23, 24 to remove the heat from the first component 12 so that the temperature of the first component 12 decreases. Therefore, a heat dissipation effect of maintaining the temperature of the first component 12 in a normal range of the operating temperature is achieved.

The following describes a simulation of a heating result according to the above-mentioned second embodiment. Please refer to FIG. 6, at the temperature of −30 degrees Celsius, which is the first environmental temperature of the second embodiment, the first component 12 receives 15 W power for operating. Then, the first working fluid of the first heat pipe 21, 22 performs heat transfer to the second component 13, 18. But the second working fluid of the second heat pipe 23, 24 may not perform heat transfer at the same time. According to the embodiment, the second component 13 in FIG. 6 is a FDB hard disk and the temperature of the FDB hard disk is above the lowest operating temperature of the FDB hard disk (i.e. 0 degree Celsius). The second component 18 is a battery, and the temperature of the battery is above the lowest operating temperature of the battery (i.e. −20 degrees Celsius). According to FIG. 6, the heating method of the embodiment may rapidly make the temperature of components rise, thereby achieving the effect of speeding up booting of the whole electronic device 10.

Figure 7:
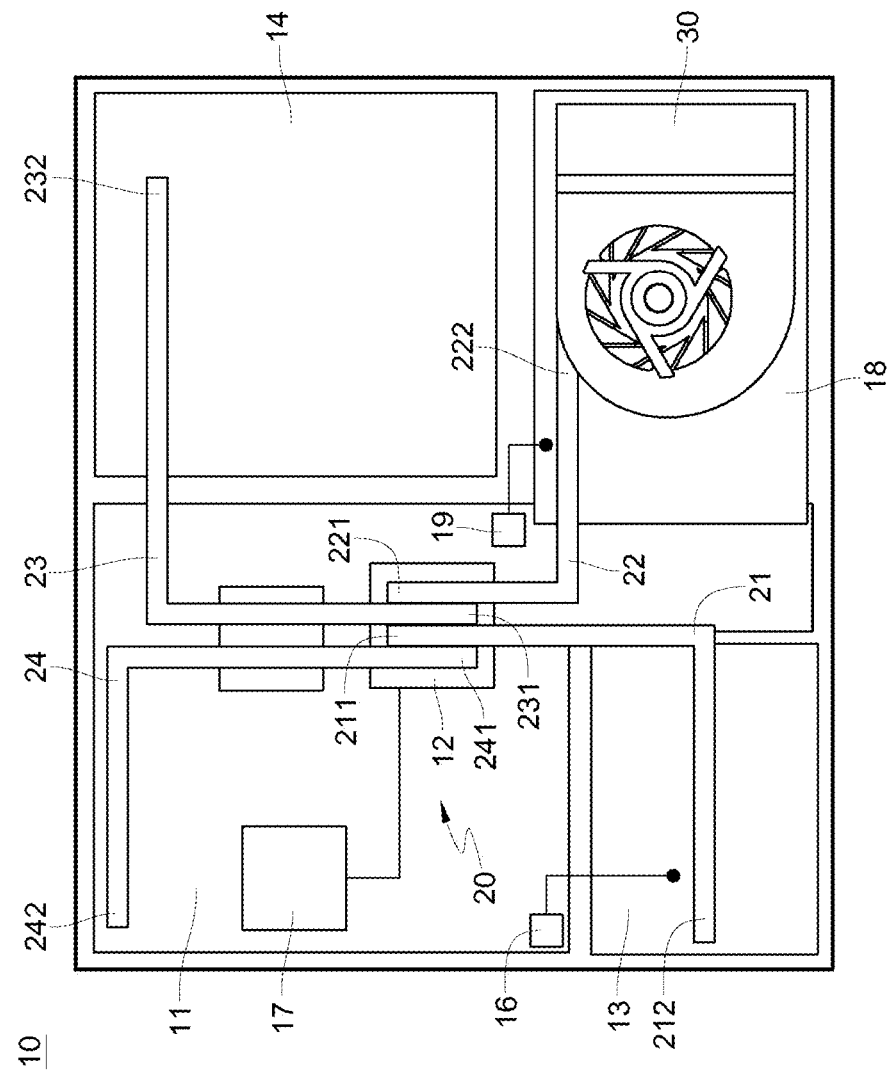
FIG. 7 is a schematic view of an electronic device according to third embodiment.

The following describes another electronic device with two kinds of heat pipes. Please refer to FIG. 7, which is a schematic view of an electronic device according to third embodiment. The element symbols in the third embodiment correspond to those in the second first embodiment with the same function or structure which is not described again.

According to the third embodiment, a fan and heat sink module 30 is disposed at a cold end 222 of a first heat pipe 22, thereby enforcing a heat dissipation effect of the first heat pipe 22 effectively.

To sum up, the embodiment discloses the speed-up booting module of the electronic device. During the booting process in the low temperature environment, by adjusting the boiling point of the first heat pipe, the second component is heated by the heat of the first component to make the temperature of the second component reach the operating temperature of the second component. When the electronic device operates normally, the heat from the first component is transferred to the second component to perform heat dissipation on the first component.

Simultaneously, by adjusting the boiling points of the working fluid contained in the first heat pipe and the second heat pipe respectively, the speed-up booting module may efficiently guide the heat into the second component which needs to be heated from the first component. Therefore, the effects of speeding up booting may also be achieved via the first heat pipe and the second heat pipe.

The speed-up booting module with single heat pipe or several heat pipes with different degrees of boiling points according to the embodiment may provide cooling at high temperature and heating at low temperature alternatively. Therefore, the problem that a heating module and a heat dissipation module disposed in a conventional electronic device at the same time increase weight and volume of the electronic device is solved. Otherwise, the effects of speeding booting up and making the electronic device thinner and lighter are achieved.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A speed-up booting module of an electronic device, comprising:

a first heat pipe, comprising a hot end connected to a first component; a cold end connected to a second component; and a first working fluid; wherein when a booting process is performed at a first environmental temperature, the first environmental temperature is higher than or equal to a boiling point of the first working fluid, the heat from the first component in operation is transferred to the second component, so that a temperature of the second component reaches an operating temperature of the second component; and a second heat pipe, comprising a hot end connected to the first component; a cold end connected to a third component; and a second working fluid, a boiling point of the second working fluid of the second heat pipe being higher than the boiling point of the first working fluid of the first heat pipe; wherein at a second environmental temperature, a temperature of the second working fluid reaches a boiling point of the second working fluid, the heat from the first component in operation is transferred heat to the third component.

2. The speed-up booting module of the electronic device according to claim 1, wherein the first environmental temperature is less than or equal to the boiling point of the second working fluid of the second heat pipe.

3. The speed-up booting module of the electronic device according to claim 1, wherein the second environmental temperature is higher than the first environmental temperature.

4. The speed-up booting module of the electronic device according to claim 1, wherein the first working fluid is Freon-22, NH3, Freon-113, Acetone (C3H6O), Methanol or water (H2O).

5. The speed-up booting module of the electronic device according to claim 1, wherein the second working fluid is water.

6. The speed-up booting module of the electronic device according to claim 5, wherein a pressure of the second heat pipe is greater than 18.5 kilopascals (kPa).

7. The speed-up booting module of the electronic device according to claim 1, wherein the first working fluid is water, a pressure of the first heat pipe is between 6 kPa to 10 kPa, the second working fluid is water, and a pressure of the second heat pipe is greater than 18.5 kPa.

8. The speed-up booting module of the electronic device according to claim 1, wherein when the booting process is performed at the first environmental temperature, a first power supply is provided so that a first thermal change of the first component is generated, and the first working fluid of the first heat pipe transfers the heat from the first component to the second component, the temperature of the second component reaches the operating temperature of the second component.

9. The speed-up booting module of the electronic device according to claim 1, wherein when the electronic device is at the second environmental temperature, a second power supply is provided to the first component so that a second thermal change of the first component is generated, the first working fluid of the first heat pipe transfers the heat from the first component to the second component, and the second working fluid of the second heat pipe transfers the heat from the first component to the third component.

10. The speed-up booting module of the electronic device according to claim 1, further comprising:
a power supply device for supplying power to the first component so that the first component is operated to generate the heat.

11. The speed-up booting module of the electronic device according to claim 1, further comprising:
a thermal sensor for detecting the temperature of the second component.

12. A method for speed-up booting an electronic device, comprising:
providing a first heat pipe, the first heat pipe comprising a hot end connected to a first component, a cold end connected to a second component, and a first working fluid;
providing a second heat pipe, the second heat pipe comprising a hot end connected to the first component, a cold end connected to a third component, and a second working fluid, wherein a boiling point of the second working fluid of the second heat pipe is higher than a boiling point of the first working fluid of the first heat pipe;
performing a booting process to provide a first power supply at an first environmental temperature, the first power supply being supplied to the first component, wherein the first component generates a first thermal change and the first working fluid of the first heat pipe transfers heat from the first component to the second component, so that a temperature of the second component reaches an operating temperature of the second component;
booting the second component to complete the booting process; and
providing a second power supply, the second power supply being supplied to the first component, wherein the first component generates a second thermal change and the first working fluid of the first heat pipe transfers heat from the first component to the second component, and the second working fluid of the second heat pipe transfers the heat from the first component to the third component.

13. The method for speed-up booting the electronic device according to claim 12, wherein the first working fluid is Freon-22, NH3, Freon-113, Acetone, Methanol or water.

14. The method for speed-up booting the electronic device according to claim 12, wherein the second working fluid is water.

15. The method for speed-up booting the electronic device according to claim 14, wherein a pressure of the second heat pipe is greater than 18.5 kPa.

16. The method for speed-up booting the electronic device according to claim 12, wherein the first working fluid is water, a pressure of the first heat pipe is between 6 kPa to 10 kPa, the second working fluid is water, and a pressure of the second heat pipe is greater than 18.5 kPa.

17. The method for speed-up booting the electronic device according to claim 12, wherein the first environmental temperature is less than or equal to the boiling point of the second working fluid of the second heat pipe.

* * * * *